United States Patent
Fullowan et al.

[11] Patent Number: 5,176,792
[45] Date of Patent: Jan. 5, 1993

[54] METHOD FOR FORMING PATTERNED TUNGSTEN LAYERS

[75] Inventors: Thomas R. Fullowan, Warren; Stephen J. Pearton, Summit; Fan Ren, Warren, all of N.J.

[73] Assignee: AT&T Bell Laboratories, Murray Hill, N.J.

[21] Appl. No.: 783,647

[22] Filed: Oct. 28, 1991

[51] Int. Cl.$^5$ .............................. H01L 21/00
[52] U.S. Cl. ..................... 156/652; 156/643; 156/646; 156/659.1; 156/656; 437/187
[58] Field of Search ............ 156/643, 646, 664, 659.1, 156/656, 637, 652; 437/187

[56] References Cited

U.S. PATENT DOCUMENTS

| | | | |
|---|---|---|---|
| 4,674,174 | 6/1987 | Kishita et al. | 437/41 |
| 4,892,835 | 1/1990 | Rabinzohn et al. | 437/22 |
| 4,898,804 | 2/1990 | Rauschenbach et al. | 437/180 |
| 4,900,398 | 2/1990 | Chen | 156/659.1 |
| 5,032,538 | 7/1991 | Bozler et al. | 437/83 |

FOREIGN PATENT DOCUMENTS 63-036547 2/1988 Japan.
1-236622 9/1989 Japan.

OTHER PUBLICATIONS

Shattenburg et al. *J. Vac. Sci. Technol.* B3, 272 (1985).
Suzuki et al. *J. Electrochem. Soc.* 129, 2764 (1982).
Tennant et al. *J. Vac. Sci. Technol.* B7, 1836 (1989).
Tachi et al. *J. Vac. Sci. Technol.* A9, 796 (1991).

*Primary Examiner*—Brian E. Hearn
*Assistant Examiner*—George Goudreau
*Attorney, Agent, or Firm*—Glen E. Books

[57] ABSTRACT

The present applicants have discovered that a layer predominantly comprising tungsten can be formed into precise patterns having substantially vertical walls by using titanium as a mask and plasma etching in a fluorine-containing plasma such as $CF_4$ or $SF_6$. The success of the process is believed attributable to the occurrence of an etch stop reaction on the sidewalls of the tungsten. The products of the reaction inhibit horizontal etching. After the tungsten is etched, the titanium mask can be selectively removed, as by etching in dilute HF. Each step in the process can be effected without subjecting the workpiece to voltage magnitudes in excess of 200 volts or temperatures outside the range between room temperature and 200° C.

6 Claims, 2 Drawing Sheets

FIG. 1
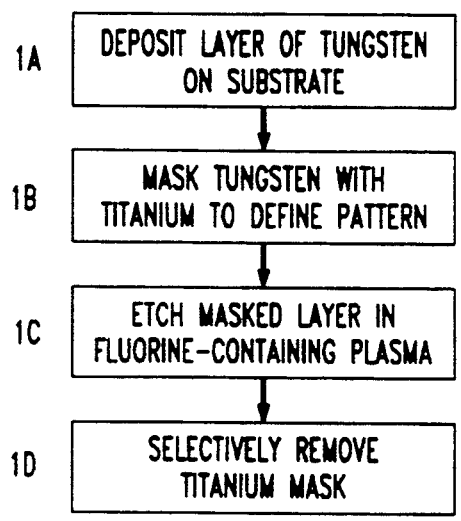
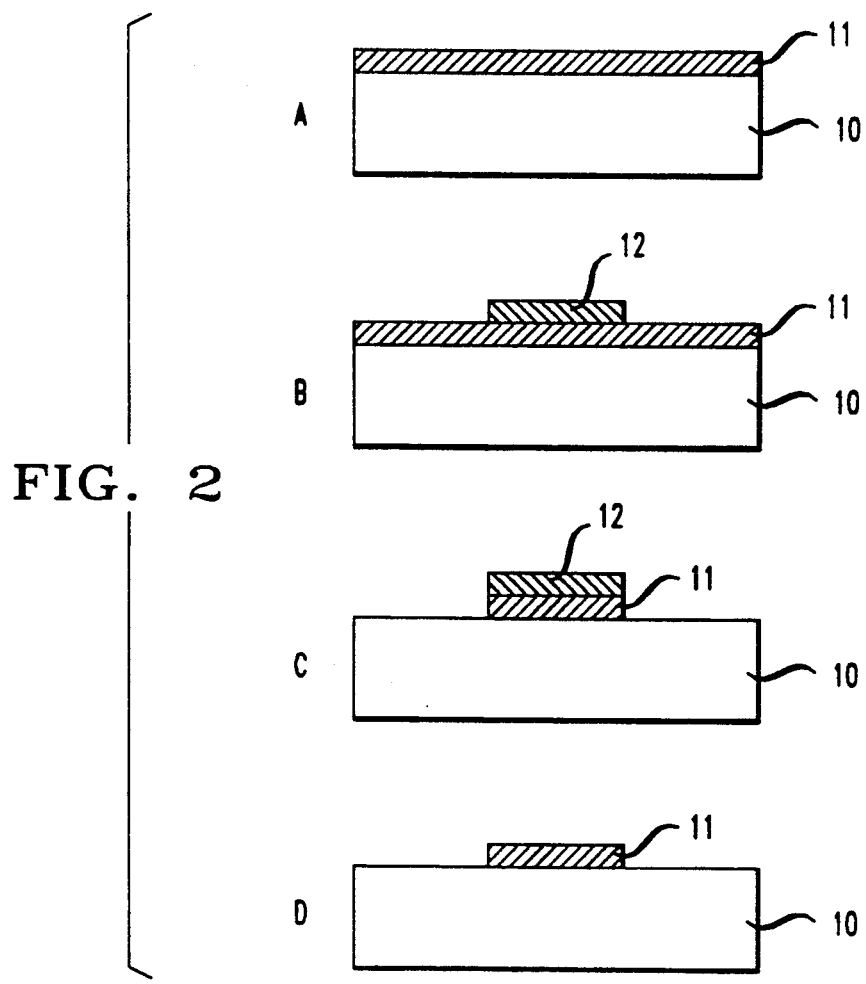
FIG. 2

5,176,792

METHOD FOR FORMING PATTERNED TUNGSTEN LAYERS

FIELD OF THE INVENTION

This invention relates to a method of forming a patterned tungsten layer and, more particularly, to a method for forming precisely patterned tungsten contacts on a III-V semiconductor with minimal damage to the semiconductor.

BACKGROUND OF THE INVENTION

Because of their reliability and tolerance of high temperature processing, tungsten ohmic and Schottky contacts are highly desirable in III-V microelectronic devices. However, it is difficult to form patterns of tungsten with the precision required in modern microelectronic devices.

Tungsten can be readily deposited in thin layers at low temperature using rf sputtering. However efforts to pattern the deposited film encounter the difficulty that tungsten etches isotropically. While it is desired to etch only the tungsten unprotected by a photoresist mask, the tungsten also etches laterally, undercutting the mask. As a consequence, vertical profiles and critical feature dimensions, such as submicron FET gates, cannot be successfully transferred to the underlying tungsten using conventional photolithography.

Various attempts have been made to enhance the precision of pattern transfer to tungsten, but none provide a clear solution to the problem of forming tungsten contacts on III-V semiconductors. For example, Shattenburg et al. report using $CBrF_3$ or $CHF_3$ to etch tungsten while depositing polymer on the sidewalls to impede horizontal etching (*J. Vac. Sci. Technol.* B3, 272 (1985). The result is transferred features which are inflated at the base. Others report that using $SF_6$ or $CF_4$ plasma discharges create fluorine radicals which undercut masks and result in loss of feature size. See, for example, Suzuki et al., *J. Electrochem. Soc.* 129, 2764 (1982). Gas mixes of $SF_6$—$CBrF_3$ or $SF_6$—$CHF_3$ reduce undercut, but nonetheless yield isotropic profiles. (See Tennant et al., *J. Vac. Sci. Technol.* B7, 1836 (1989). Recently vertical etching of tungsten in $SF_6$ at low temperatures has been reported, but the method requires unique etching equipment and is not well suited for commercial manufacture. See S. Tachi et al., *J. Vac. Sci. Technol.* A9,796 (1991).

SUMMARY OF THE INVENTION

The present applicants have discovered that a layer predominantly comprising tungsten can be formed into precise patterns having substantially vertical walls by using titanium as a mask and plasma etching in a fluorine-containing plasma such as $CF_4$ or $SF_6$. The success of the process is believed attributable to the occurrence of an etch stop reaction on the sidewalls of the tungsten. The products of the reaction inhibit horizontal etching. After the tungsten is etched, the titanium mask can be selectively removed, as by etching in dilute HF. Each step in the process can be effected without subjecting the workpiece to voltage magnitudes in excess of 200 volts or temperatures outside the range between room temperature and 200° C.

BRIEF DESCRIPTION OF THE DRAWINGS

The advantages, nature and various additional features of the invention will appear more fully upon consideration of the illustrative embodiments now to be described in connection with the accompanying drawings. In the drawings:

FIG. 1 is a flow diagram of the preferred method of patterning a tungsten layer in accordance with the invention.

FIG. 2 shows schematic cross sections of the workpiece at various steps in the process of FIG. 1.

Figure 4:
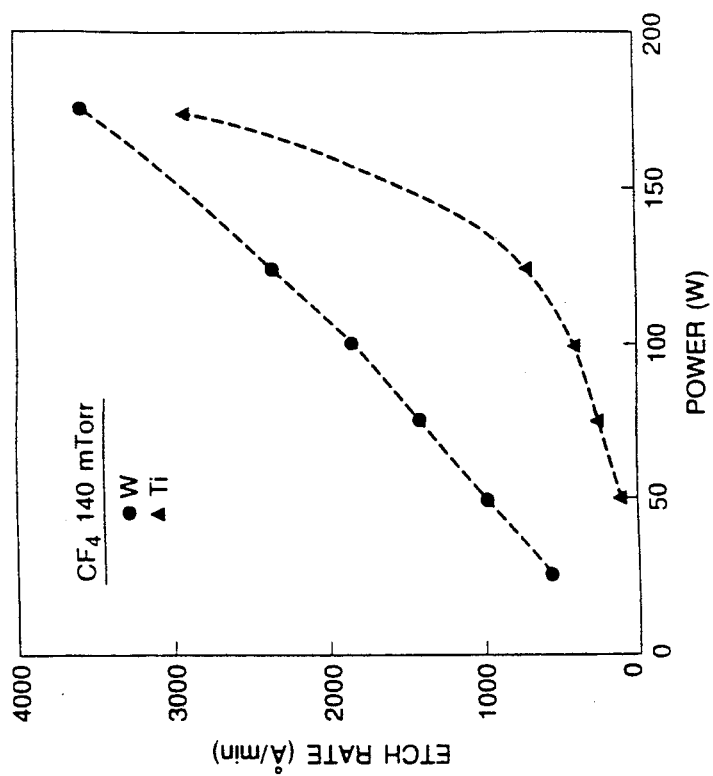
FIG. 4 is a graphical illustration of etch rate as a function of plasma generator power.

It is to be understood that these drawings are for purposes of illustrating the concepts of the invention and, except for graphical illustrations, are not to scale.

DETAILED DESCRIPTION

Referring to the drawings, FIG. 1 is a flow diagram illustrating the process for patterning a tungsten layer. As shown in FIG. 1A the first step involves depositing a layer of tungsten on a substrate. Preferably the substrate is a III-V semiconductor substrate such as gallium arsenide. As a preliminary step the substrate is thoroughly cleaned as by an $O_2$ plasma de-scumming and followed by dipping in dilute HCl to remove surface oxides. The tungsten layer is then deposited, preferably by low temperature rf sputtering. The substrate and a tungsten target are disposed in a low pressure, inert gas ambient such as argon at 1–30 milliTorr (mT). An rf plasma is struck and a DC bias of 300 V applied to the target induces sputtering of tungsten from the target onto the substrate. The temperature is preferably below about 150° C. For use in the fabrication of microelectronic contacts, the tungsten layer has a thickness of less than a micrometer, and is typically about 4000 angstroms. The substrate 10 with a deposited tungsten layer 11 is schematically illustrated in FIG. 2A.

The next step shown in FIG. 1B is masking the tungsten layer with a titanium mask. The masking step can be conveniently accomplished by applying a layer of titanium having a thickness of less than a micrometer and using a conventional lift-off process to form the mask pattern. The tungsten layer is coated with EBR-9 resist and the desired pattern for the mask is defined by direct write electron-beam lithography. A layer of titanium, preferably about 400 nm thick, is then deposited onto the workpiece in an Airco 1800 e-beam evaporator. The titanium which contacts unmasked tungsten strongly adheres. The titanium not in contact with the tungsten is lifted off by an acetone solvent spray. The result, shown in FIG. 2B, is a residual titanium mask 12 overlying the tungsten layer 11.

As illustrated in FIG. 1C, the third step is etching the mask workpiece to selectively remove the unmasked tungsten. This etching is preferably reactive ion etching in a fluorine-containing plasma. The etching can be conveniently performed in a parallel plate plasma etcher such as a Plasma Therm SL 772, water-cooled to room temperature. Advantageously etching is effected in $SF_6$/Ar gas using a 1 mT pressure, a DC bias on the sample of $-100$ V, and a plasma frequency of 13.56 MHz. A 25% overetch was performed to allow for nonuniformity of the tungsten film and to compensate for any loading effects. Alternatively, etching was effected employing a $CF_4/O_2$ mixture at a pressure of 5 mT and a D.C. bias of $-350$ V.

The result of this etching step is removal of the tungsten in those regions where it is not protected by the titanium mask. The resulting structure is shown in FIG. 2C. What is surprising is that the tungsten is etched anisotropically showing vertical side walls and virtually no undercut of the titanium mask. This highly desirable characteristic is believed attributable to the deposition of an involatile species such as $TiF_4$ one the sidewalls. The $TiF_4$ inhibits etching at the vertical side walls. The etching is anisotropic so long as titanium remains on the tungsten.

Figure 3:
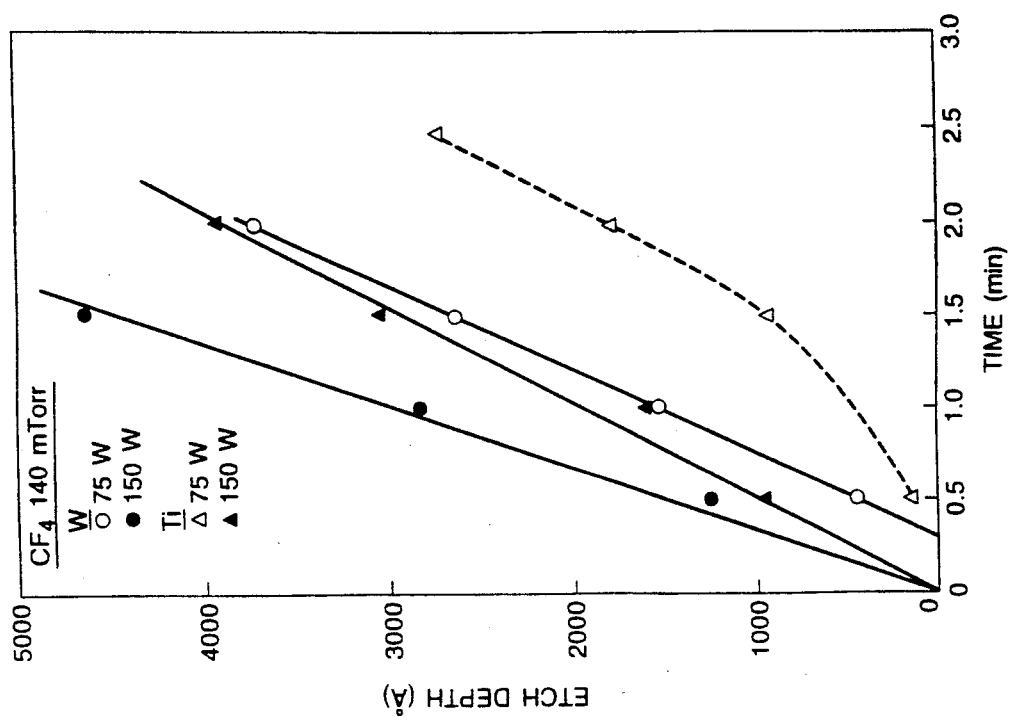
FIG. 3 is a graphical illustration of etch depth as a function of time.

FIG. 3 shows the etch depth as a function of time for both tungsten W and titanium Ti at plasma power levels of 75 W and 150 W. The data was taken using Technics Micro Reactive Ion Etch Series 800 Plasma System utilizing 30 KHz plasma excitation with $CF_4$ plasma.

FIG. 4 shows the etch rate in angstroms per minute as a function of the plasma power. The etch rates of both tungsten and titanium increase as a function of both power and pressure. At lower powers, etch rates of both tungsten and titanium tend to increase gradually and then become more nearly linear. This suggests the existence of native oxides on the surfaces which must be removed by ion bombardment before chemical etching can be initiated.

Over the range of pressures examined, the etch rates of both tungsten and titanium generally increase with increasing pressure. Selectivities range from 8:1 to 1.5:1 as a function of power level at a given pressure. SEM examination showed that the anisotropic character of the tungsten etching is not a function of pressure while the titanium mask is present. Vertical profiles were reproduced with no loss of feature dimensions over a wide range of pressures from 1 mT to 140 mT. The fact that the tungsten etching can be achieved with low negative DC bias of magnitude less than 200 V means that damage to the exposed semiconductor is not significant.

The final step shown in FIG. 1D is selective removal of the titanium mask. This step is optional depending on the application intended. Titanium removal can be easily achieved without adversely affecting the exposed semiconductor or tungsten by immersing the workpiece in a dilute HF solution. The resulting structure with the mask layer 12 removed is shown in FIG. 2D.

It is to be understood that the above-described embodiments are illustrative of only a few of the many possible specific embodiments which can represent applications of the principles of the invention. For example, while the invention has been described in reference to the patterning of a layer of tungsten, it also applies to the patterning of a layer predominantly comprising tungsten but which may also contain other elements such as silicon, or nitrogen in minor amounts. This would include tungsten silicide and tungsten nitride. Numerous and varied other arrangements can be made by those skilled in the art without departing from the spirit and scope of the invention.

We claim:

1. A method of forming a patterned tungsten contact to a gallium arsenide substrate comprising the steps of:
   depositing a layer predominantly comprising tungsten on said gallium arsenide substrate;
   forming on said tungsten layer a mask comprising titanium having a thickness of less than one micrometer; and
   removing the unmasked tungsten by reactive ion etching in a fluorine-containing plasma with a negative bias voltage of magnitude less than 200 volts applied between the substrate and the plasma during etching of the tungsten; and
   selectively removing the titanium mask relative to the underlying tungsten layer using an HF solution after etching the unmasked tungsten.

2. The method of claim 1 wherein said tungsten is deposited by rf sputtering.

3. The method of claim 1 wherein said tungsten layer is masked with titanium by a lift off process.

4. The method of claim 1 wherein the unmasked tungsten is removed by reactive ion etching in an ambient comprising $SF_6$.

5. The method of claim 1 wherein the unmasked tungsten is removed by reactive ion etching in an ambient comprising $CF_4$.

6. The method of claim 1 wherein said reactive ion etching is effected in an ambient gas pressure in the range 1 mT to 140 mT.

* * * * *